United States Patent
Shin

(10) Patent No.: US 7,320,098 B2
(45) Date of Patent: Jan. 15, 2008

(54) SEMICONDUCTOR INTEGRATED CIRCUIT DEVICE HAVING SCAN FLIP-FLOP CIRCUIT

(75) Inventor: Young-Min Shin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 208 days.

(21) Appl. No.: 11/122,382

(22) Filed: May 5, 2005

(65) Prior Publication Data
US 2005/0268191 A1    Dec. 1, 2005

(30) Foreign Application Priority Data
May 28, 2004    (KR)    .................... 10-2004-0038446

(51) Int. Cl.
*G01R 31/28*    (2006.01)
(52) U.S. Cl. .............. 714/726; 714/30; 714/724; 714/731; 714/744; 365/233; 327/202
(58) Field of Classification Search .................... None
See application file for complete search history.

(56) References Cited

U.S. PATENT DOCUMENTS

| | | | | |
|---|---|---|---|---|
| 5,173,904 A | * | 12/1992 | Daniels et al. | 714/729 |
| 5,416,784 A | * | 5/1995 | Johnson | 714/733 |
| 5,784,384 A | * | 7/1998 | Maeno | 714/726 |
| 6,163,192 A | * | 12/2000 | Lee et al. | 327/212 |
| 6,169,704 B1 | * | 1/2001 | Sher | 365/233 |
| 6,348,825 B1 | | 2/2002 | Galbi et al. | 327/218 |
| 6,539,497 B2 | * | 3/2003 | Swoboda et al. | 714/30 |
| 6,911,845 B2 | * | 6/2005 | Hossain et al. | 326/93 |
| 2004/0088659 A1 | * | 5/2004 | Mori | 716/2 |

FOREIGN PATENT DOCUMENTS

| | | |
|---|---|---|
| JP | 10-177060 | 6/1998 |
| JP | 2000-353939 | 12/2000 |
| JP | 2003-167030 | 6/2003 |

OTHER PUBLICATIONS

UC Berkeley, "Lab 1 Transistors", Fall 2002, UC Berkeley, pp. 1-5, found on the internet at http://inst.eecs.berkeley.edu/~cs150/fa02/handouts/2/Lab/lab1.pdf.*

* cited by examiner

*Primary Examiner*—Guy Lamarre
*Assistant Examiner*—John P Trimmings
(74) *Attorney, Agent, or Firm*—Mills & Onello LLP

(57) ABSTRACT

A semiconductor integrated circuit device has a normal operation mode and a scan test operation mode, and includes a pulse generating circuit and a scan flip-flop circuit. The pulse generating circuit generates pulse signals synchronized with a clock signal in each of the normal and scan test operation modes. The scan flip-flop circuit latches data in response to the pulse signals from the pulse generating circuit signal in each of the normal and scan test operation modes.

32 Claims, 4 Drawing Sheets

SEMICONDUCTOR INTEGRATED CIRCUIT DEVICE HAVING SCAN FLIP-FLOP CIRCUIT

CROSS-REFERENCE TO RELATED APPLICATIONS

This U.S. non-provisional patent application claims priority under 35 U.S.C. § 119 to Korean Patent Application 2004-38446 filed on May 28, 2004, the entire contents of which are hereby incorporated by reference.

BACKGROUND OF THE INVENTION

The present invention relates to semiconductor integrated circuits, and more specifically to semiconductor integrated circuits including a high-speed flip-flop circuit capable of scanning.

Flip-flop circuits are commonly employed in semiconductor integrated circuit devices for performing data input/output operations in synchronization with a clock signal. For example, a flip-flop circuit can be used to latch data during a high-level interval of the clock signal and to maintain the latched data during a low-level interval thereof. Alternatively, the contrary case is possible. Since delay time from a point of data input to data output can be long, such flip-flop circuits are not adaptable to high-speed semiconductor integrated circuits.

To address this limitation, a flip-flop circuit based on a pulse (hereinafter, referred to as a pulse-based flip-flop circuit) has been proposed. In normal operation, a clock signal is not directly applied to the pulse-based flip-flop circuit, but rather a pulse signal, generated based on the clock signal is applied thereto. In this embodiment, delay time between data latch and data output is reduced, which enables the pulse-based flip-flop circuit to perform operations (i.e., data latch and maintenance operations) at a faster rate than conventional flip-flop circuits. Therefore, a semiconductor integrated circuit device can operate rapidly using the pulse-based flip-flop circuit.

With increased device integration, it is more and more difficult to test semiconductor integrated circuits because such integrated semiconductor integrated circuits include many input terminals. To achieve testability of the semiconductor integrated circuit, a scan pass method is used. In the scan pass approach, flip-flop circuits are configured to operate as a shift register (hereinafter, referred to as a scan flip-flop circuit). In this method, a value stored in the scan flip-flop circuit is controlled and sampled by a host device under test in a given time period, for example, using a shift function.

To test the semiconductor integrated circuit by means of the scan pass technique, a plurality of scan flip-flop circuits are installed in the semiconductor integrated circuit. The scan flip-flop circuits operate as a flip-flop during normal operation and during a scan test operation of the semiconductor integrated circuit device. Input/output terminals of the scan flip-flops are connected in series to arrange as a shift register circuit. In one example, each of the scan flip-flops is embodied as a pulse-based flip-flop. In general, each of the scan flip-flops performs a normal operation based on a pulse signal and performs a scan test operation based on a clock signal.

Such scan flip-flops are disclosed in the Japanese Patent No. 2003-167030, entitled "SEMICONDUCTOR INTEGRATED CIRCUIT", and in the Japanese Patent No. 10-177060, entitled "SCANNING CIRCUIT", respectively.

In the case of a scan flip-flop circuit including a scan mode of operation, operation speed of the semiconductor integrated circuit device may be decreased due to an increase in path delay because of the loading of the additional scan circuit. In addition, when the scan flip-flop circuit is embodied to operate in synchronization with a pulse signal and a clock signal according to the operation modes, mode switch timing may become an issue at the time of switching between the scan test operation and the normal operation.

SUMMARY OF THE INVENTION

The present invention provides a scan flip-flop capable of performing a scan operation without a decrease of speed in a normal operation mode and a semiconductor integrated circuit device having the same.

The present invention further provides a scan flip-flop circuit that operates based on a pulse signal in both a normal operation and a scan test operation and an integrated circuit device having the same.

In one aspect, the present invention is directed to a semiconductor integrated circuit device having a normal operation mode and a scan test operation mode comprising: a pulse generating circuit generating pulse signals synchronized with a clock signal in each of the normal operation mode and the scan test operation mode; and a scan flip-flop circuit for latching data in response to the pulse signals in each of the normal operation mode and the scan test operation mode.

In one exemplary embodiment of the present invention, the pulse generating circuit comprises: a first signal generator generating a first pulse signal PPC that is synchronized with the clock signal; a second signal generator generating a second pulse signal NPC that is synchronized with the first pulse signal in response to a control signal indicating the scan test operation mode; and a third signal generator generating a third pulse signal SPC synchronized with the first pulse signal in response to the control signal.

In another exemplary embodiment of the present invention, the first pulse signal is generated in synchronization with any one of a low-to-high transition and a high-to-low transition.

In another exemplary embodiment of the present invention, the second pulse signal is generated in synchronization with the first pulse signal when the control signal indicates the normal operation mode.

In another exemplary embodiment of the present invention, the third pulse signal is generated in synchronization with the first pulse signal when the control signal indicates the scan test operation mode.

In another exemplary embodiment of the present invention, the scan flip-flop circuit comprises: a first input circuit receiving a normal data in response to the second pulse signal; a second input circuit receiving a scan test data in response to the third pulse signal; and a latch circuit for latching any one of outputs of the first and second input circuits in response to the first pulse signal.

In another exemplary embodiment of the present invention, each of the first and second input circuits includes a tri-state inverter operating in response to a corresponding pulse signal.

In another exemplary embodiment of the present invention, the latch circuit is connected to output terminals of the first and second input circuits and includes a tri-state inverter and a CMOS inverter performing a latch operation. In this case, the tri-state inverter operates in response to the first pulse signal.

In another exemplary embodiment of the present invention, the scan flip-flop circuit further includes an inverter connected to a common output terminal of the first and second input circuits.

In another exemplary embodiment of the present invention, the scan flip-flop circuit comprises: a first input circuit receiving a normal data in response to the second pulse signal, being connected to a first latch node; a second input circuit receiving a scan data in response to the third pulse signal, being connected to a second latch node; and a latch circuit for latching any one of outputs of the first and second input circuits in response to the first pulse signal, being connected to the first and second latch nodes.

In another exemplary embodiment of the present invention, the first input circuit includes a tri-state inverter operating in response to the second pulse signal.

In another exemplary embodiment of the present invention, the second input circuit comprises: an inverter receiving the scan data; and a tri-state inverter operating in response to a second pulse signal, being connected between the output terminal of the inverter and the second latch node.

In another exemplary embodiment of the present invention, the latch circuit includes a tri-state inverter and a CMOS inverter connected to perform a latch operation. In this case, the tri-state inverter operates in response to the first pulse signal.

In another exemplary embodiment of the present invention, the scan flip-flop circuit further includes an inverter connected to the first latch node.

In another exemplary embodiment of the present invention, an activation point of the control signal is freely determined within the rest time except for a data hold time in a cycle of the clock signal.

In another aspect, the present invention is directed to a semiconductor integrated circuit device having a normal operation mode and a scan test operation mode comprising: a first input circuit receiving a first data in response to a first pulse signal NPC in the normal operation mode; a second input circuit receiving a second data in response to a second pulse signal SPC in the scan test operation mode; and a latch circuit for latching any one of outputs of the first and second input circuits in response to a third pulse signal PPC. In this case, the first, second and third pulse signals are generated in synchronization with a transition of a clock signal in the normal operation and the scan test operation mode.

In one exemplary embodiment of the present invention, the transition of the clock signal is any one of a low-to-high transition and a high-to-low transition.

In another exemplary embodiment of the present invention, the semiconductor integrated circuit device further includes an inverter connected to a common output of the first and second input circuits.

In another exemplary embodiment of the present invention, each of the first and second input circuits includes a tri-state inverter controlled by a corresponding pulse signal.

In another exemplary embodiment of the present invention, the first and second input circuits, the latch circuit, and the inverter compose a scan flip-flop circuit.

In another exemplary embodiment of the present invention, the latch circuit includes a tri-state inverter and an inverter arranged to latch outputs of the first and second input circuits. In this case, the tri-state inverter is controlled by the third pulse signal.

In another exemplary embodiment of the present invention, the first input circuit includes a first tri-state inverter controlled by the first pulse signal.

In another exemplary embodiment of the present invention, the second input circuit comprises: a first inverter receiving the second data; and a second tri-state inverter controlled by the second pulse signal, being connected between the inverter and the latch circuit.

In another aspect, the present invention is directed to a semiconductor integrated circuit device, comprising: a first input terminal receiving a normal data; a second input terminal receiving a scan data; a data output terminal outputting an output data; a first tri-state inverter operating in response to first pulse signals, being connected between the first input terminal and a first latch node; a second tri-state inverter operating in response to second pulse signals, being connected between the second input terminal and the first latch node; a first inverter including an input terminal connected to the first latch node and an output terminal connected to a second latch node; a tri-state inverter operating in response to third pulse signals, including an input terminal connected to the second latch node and an output terminal connected to the first latch node; and a second inverter including an input terminal connected to the first latch node and an output terminal connected to the data output terminal.

In one embodiment, the first, second and third pulse signals are generated in synchronization with a transition of a clock signal.

In another embodiment, the transition of the clock signal includes any one of a low-to-high transition and a high-to-low transition.

In another aspect, the present invention is directed to a semiconductor integrated circuit device, comprising: a first input terminal receiving a normal data; a second input terminal receiving a scan data; a data output terminal outputting an output data; a first-tri-state inverter operating in response to first pulse signals, being connected between the first input terminal and a first latch node; a second tri-state inverter and a first inverter serially connected between the second input terminal and a second latch node, the second tri-state inverter operating in response to second pulse signals; a first inverter including an input terminal connected to the first latch node and an output terminal connected to the second latch node; a tri-state inverter operating in response to third pulse signals, including an input terminal connected to the second latch node and an output terminal connected to the first latch node; and a third inverter including an input terminal connected to the first latch node and an output terminal connected to the data output terminal.

In one embodiment, the first, second and third pulse signals are generated in synchronization with a transition of a clock signal.

In another embodiment, the transition of the clock signal includes any one of a low-to-high transition and a high-to-low transition.

In another aspect, the present invention is directed to a method, comprising: generating first, second and third pulse signals in response to a clock signal; and latching a data in response to the first, second and through third pulse signals, wherein the data input in a normal operation mode is latched in synchronization with the first and second pulse signals, and the data input in a scan test operation mode is latched in synchronization with the first and the third pulse signals.

In one embodiment, the first, second and third pulse signals are generated in synchronization with a transition of a clock signal.

In another embodiment, the transition of the clock signal includes any one of a low-to-high transition and a high-to-low transition.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, an exemplary embodiment of the present invention is described in conjunction with the accompanying drawings.

Figure 1:
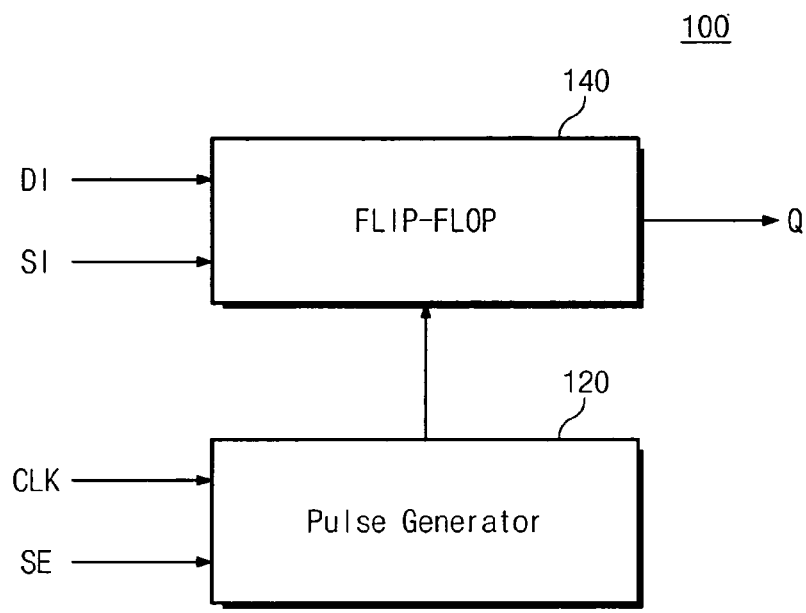
FIG. 1 is a schematic block diagram of a semiconductor integrated circuit device.

FIG. 1 is a schematic block diagram of a semiconductor integrated circuit device in accordance with the present invention. Referring to FIG. 1, a semiconductor integrated circuit device 100 includes a pulse generating circuit 120 and a scan flip-flop circuit 140. The scan flip-flop circuit 140 is controlled by a pulse generating circuit 120 to perform a latch function and a scan test function. The scan flip-flop circuit 140 latches and outputs a scan data SI in response to pulse signals. The scan flip-flop circuit 140 latches and outputs a normal data DI in response to the pulse signal from the pulse generating circuit 120 during a normal mode of operation. The scan flip-flop circuit 140 latches and outputs a scan data SI in response to pulse signals from the pulse generating circuit 120 during a scan test mode of operation. The pulse generating circuit 120 generates pulse signals in response to a clock signal CLK and a control signal SE as a scan enable signal. In particular, the pulse generating circuit 120 generates pulse signals in synchronization with the clock signal CLK during a normal mode of operation and during a scan test mode of operation. In other words, during normal operation and scan test operation, a clock signal CLK is not directly applied to the scan flip-flop circuit 140; rather, pulse signals in synchronization with the clock signal CLK are applied to the scan flip-flop circuit 140.

Figure 2:
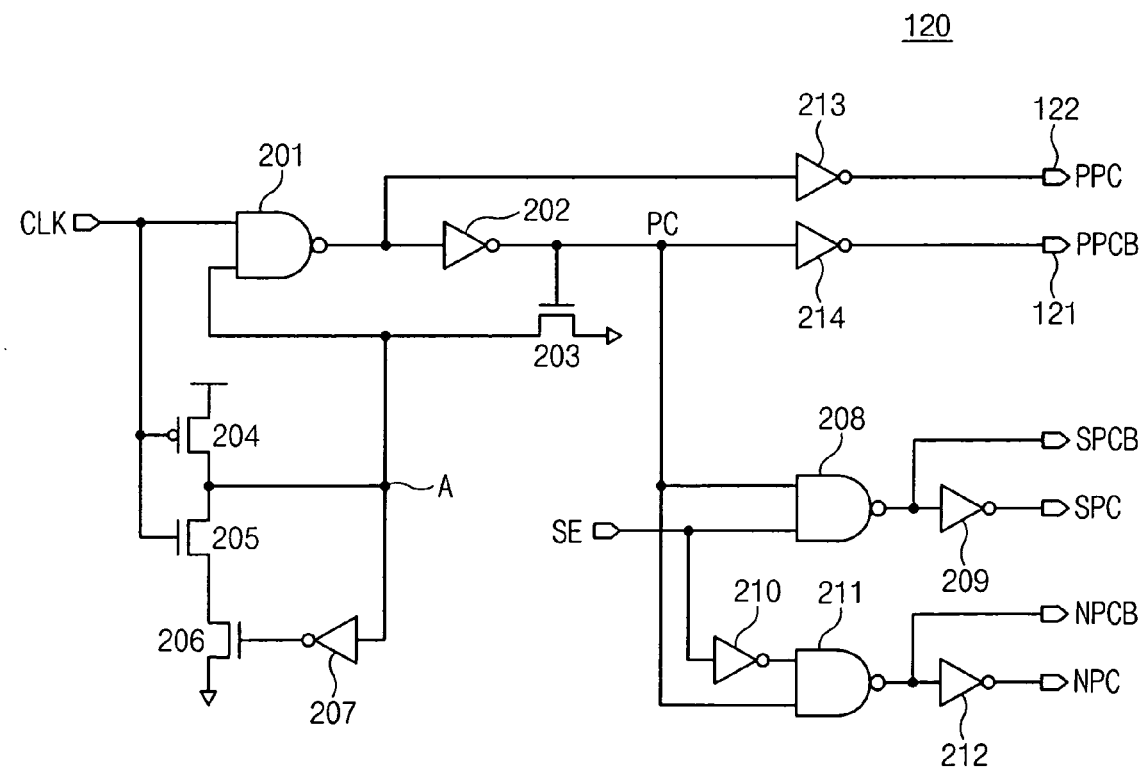
FIG. 2 is a circuit diagram of a pulse generating circuit of FIG. 1 according to an exemplary embodiment of the present invention.

FIG. 2 is a circuit diagram of an embodiment of the pulse generating circuit of FIG. 1. Referring to FIG. 2, the pulse generating circuit 120 includes NAND gates 201, 208 and 211, inverters 202, 207, 209, 210, 212, 213, and 214, NMOS transistors 203, 205, and 206 and a PMOS transistor 204.

A clock signal CLK is applied to one input terminal of the NAND gate 201, and the other input terminal of the NAND gate 201 is electrically connected to node A. Inverters 202 and 214 are connected in series between an output terminal of a NAND gate 201 and an output terminal PPCB 121. An inverter 213 is connected between an output terminal of the NAND gate 201 and the output terminal PPC 122. An NMOS transistor 203 including a gate that is connected to the output terminal of the inverter 202 has a current path formed between node A and a ground voltage. A PMOS transistor 204 is connected between the power supply voltage and the node A and has a gate that is controlled by a clock signal CLK. The NMOS transistors 205 and 206 are connected in series between the node A and the ground voltage. The NMOS transistor 205 has a gate that is controlled by a clock signal CLK. An inverter 207 is connected between the node A and a gate of the NMOS transistor 206. One input terminal of the NAND gate 208 is connected to the output terminal of the inverter 202, and the other input terminal of the NAND gate 208 is connected to receive a control signal SE. An output terminal of the NAND gate 208 is connected to an inverter 209. One input terminal of the NAND gate 211 is connected to the output terminal of the inverter 202, and the other input terminal of the NAND gate 211 is connected to receive a control signal SE through an inverter 210. An output terminal of the NAND gate 211 is connected to an inverter 212.

When the input clock signal CLK has a low level, the PMOS transistor 204 is turned on and the NMOS transistor 205 is turned off. The node A is set to a high level because of the on state of the PMOS transistor 204, and the NMOS transistor 206 is thus turned off. In this case, since input signals of the NAND gate 201 all have a low level, the output signal PPC becomes is at a low level and the output signal PPCB of the inverter 214 is at a high level. If the clock signal CLK transitions from a low level to a high level, the output signal of the NAND gate 201 transitions from a high level to a low level. This causes the output signal PPC of the inverter 213 to transition from a low level to a high level, and an output signal PPCB of the inverter 214 transitions from a high level to a low level. As an output signal PC of the inverter 202 is transitioned from a low level to a high level, the NMOS transistor 203 is turned on. This, in turn, causes node A to transition from a high level to a low level.

With the high-to-low transition of the node A, the output signal PPC transitions from a high level to a low level and an output signal PPCB of the inverter 214 transitions from a low level to a high level. In this case, the NMOS transistor 206 is turned on at a high-to-low transition of the node A. Since the NMOS transistor 205 is turned on at the low-to-high transition of the clock signal CLK, a logic state of the node A is latched through the inverter 207 and the NMOS transistors 205 and 206. When a clock signal CLK transitions from a high level to a low level, the node A returns to a high level through the PMOS transistor 204 but the output signal of the NAND gate 201 is maintained at its previous state.

In accordance with the above explanation, the logic state of the node A varies at the low-to-high transition and at the high-to-low transition but the output signal PPC of the inverter 213 is pulsed only when the clock signal CLK transitions from a low level to a high level. Afterwards, output signals PPC and PPCB are referred to as "complementary first pulse signals". The first pulse signals PPC and PPCB are always activated at every low-to-high transition of the clock signal CLK regardless of whether the operation mode of the semiconductor integrated circuit device is a normal operation mode or a scan test operation mode.

When the control signal SE is at a low level indicating a normal operation mode, the NPC and NPCB signals are generated in synchronization with an output signal PC. However, the SPC and SPCB signals are generated in synchronization with an output signal PC of the inverter 202 when the control signal SE is in a high level indicating a scan test operation mode. In other words, when the control signal SE is maintained at a low level, the output signal SPCB of the NAND gate 208 is maintained to a high level and the output signal SPC of the inverter 209 to a low level. In this case, the output signal NPCB of the NAND gate 211 has an inverted phase of the output signal PC of the inverter 202 and an output signal NPC of the inverter 212 has the same phase as the output signal PC of the inverter 202. To the contrary, when the control signal SE is maintained at a high level, the output signal NPCB of the NAND gate 211 is maintained at a high level and the output signal NPC of the inverter 212 is maintained at a low level. In this case, the output signal SPCB of the NAND gate 208 has an inverted phase of the output signal PC of the inverter 202 and an output signal SPC of the inverter 209 has the same phase as the output signal PC.

Hereinafter, NPC and NPCB signals are referred to as "complementary second pulse signals", and the SPC and SPCB signals as "complementary third pulse signals". The NAND gate 201, inverters 202, 207, 213, and 214, PMOS transistor 204, and NMOS transistors 203, 205, and 206 compose a signal generator generating the first pulse signals. The NAND gate 211 and inverters 210 and 212 compose a signal generator generating the second pulse signals. The NAND gate 208 and the inverter 209 compose a signal generator generating third pulse signals.

In FIG. 2, the pulse signals PC and PPC have the same phase and may be regarded as the same signal.

Briefly, the first pulse signals PPC and PPCB are activated only at a low-to-high transition of the clock signal CLK, the second pulse signals NPC and NPCB are activated in a normal operation mode in synchronization with the first pulse signal PPC, and the third pulse signals SPC and SPCB are activated in a scan test operation mode in synchronization with the first pulse signal PPC. The first, second and third pulse signals are output to the scan flip-flop circuit 140 in FIG. 1. As a result, the scan flip-flop circuit 140 operates in response to the pulse signals synchronized with the low-to-high transition of the clock signal CLK regardless of the operation mode of the scan flip-flop circuit 140.

Figure 3:
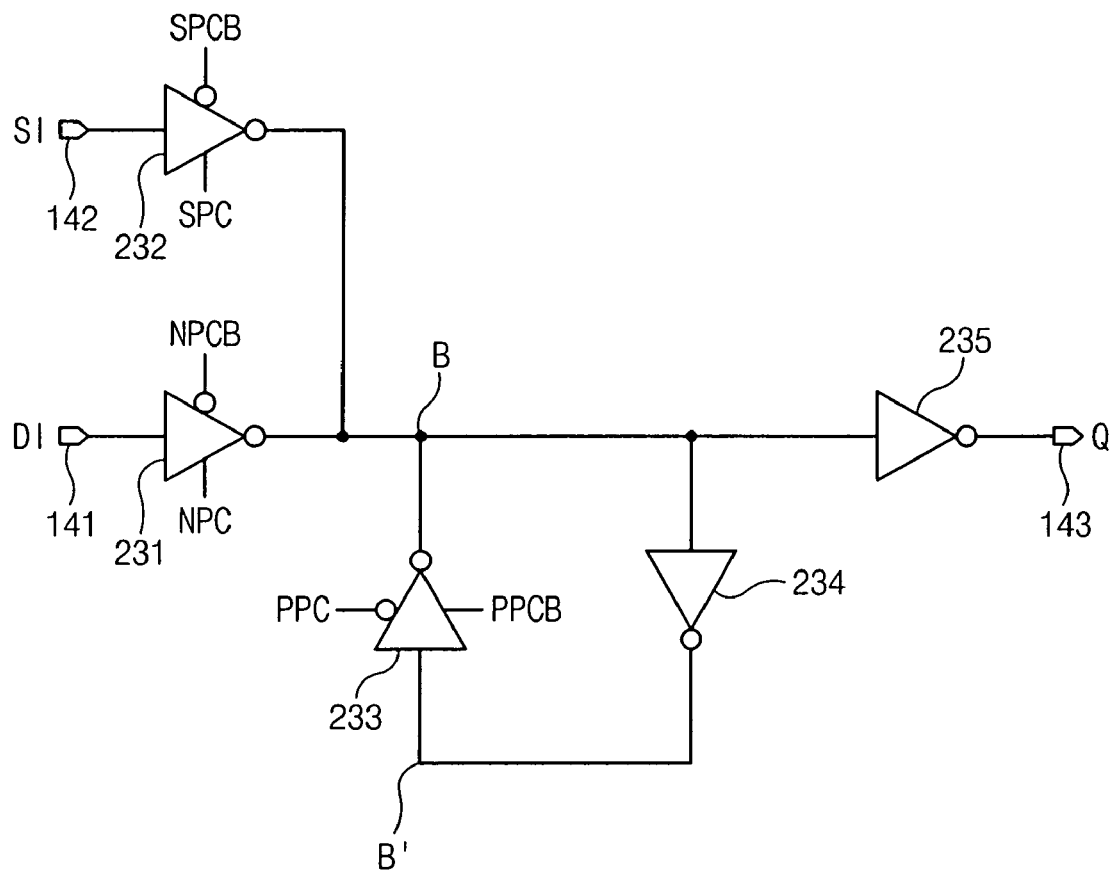
FIG. 3 is a circuit diagram of a scan flip-flop circuit of FIG. 1 according to an exemplary embodiment of the present invention.

FIG. 3 is a circuit diagram of an embodiment of the scan flip-flop circuit of FIG. 1. Referring to FIG. 3, the exemplary scan flip-flop circuit 140 of the present invention includes five inverters 231, 232, 233, 234, and 235. The inverter 231 is connected between an input terminal DI 141 and a latch node B, and the inverter 232 is connected between the input terminal SI 142 and the latch node B. The inverter 235 is connected between the latch node B and an output terminal Q 143. The inverters 233 and 234 are configured to latch a normal data DI and compose a latch for latching a scan data SI during a scan data operation.

In FIG. 3, the inverter 231 composes an input circuit that receives a normal data DI in response to the second pulse signals NPC and NPCB, the inverter 232 composes an input circuit that receives a scan data in response to the third pulse signals SPC and SPCB, and the inverter 233 is controlled in response to the first pulse signals PPC and PPCB. Each of the inverters 231, 232, and 233 is a tri-state inverter, and each of the inverters 234 and 235 is a standard CMOS inverter.

Figure 4:
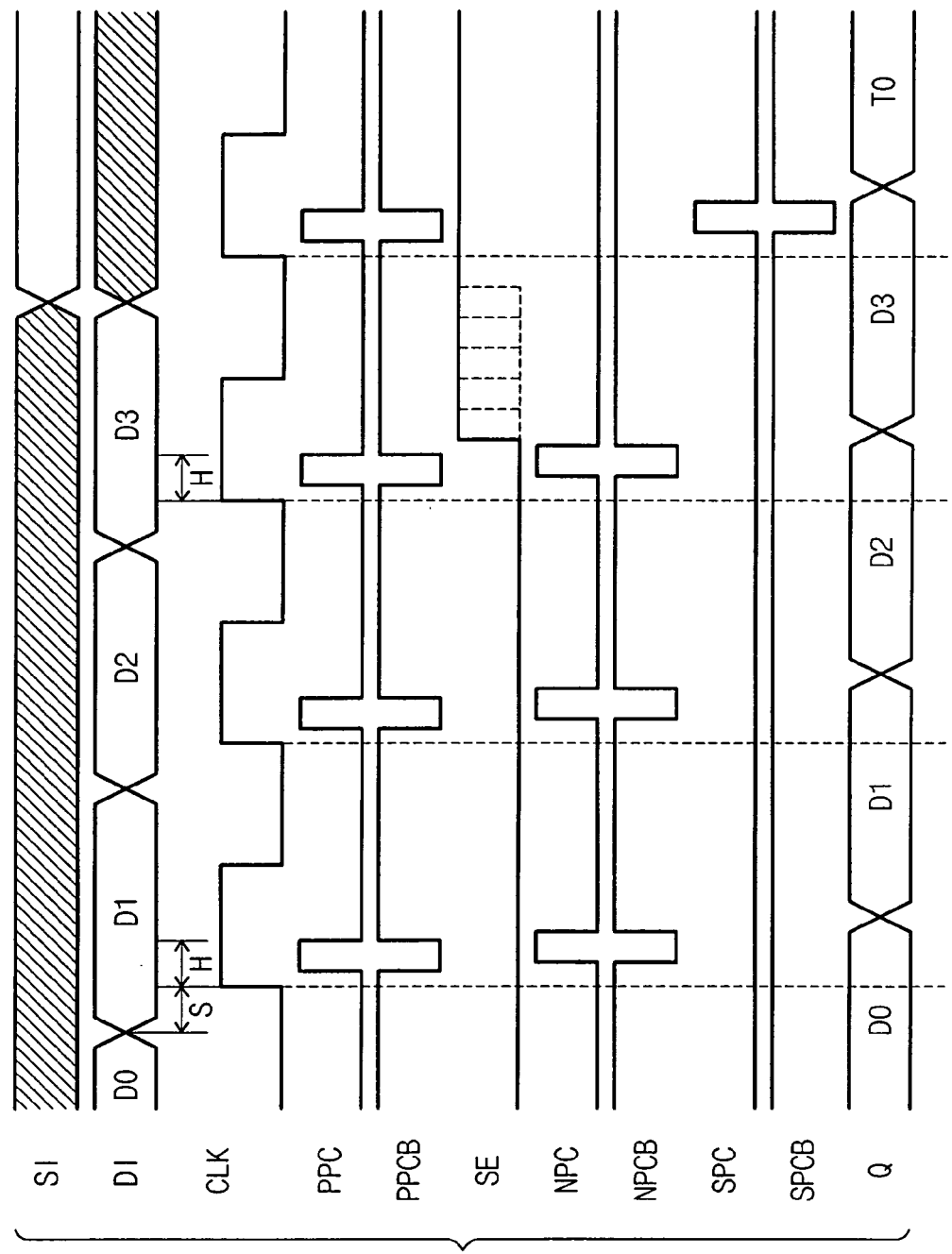
FIG. 4 is a timing diagram illustrating normal and scan test operations of the semiconductor integrated circuit device according to an exemplary embodiment of the present invention.

FIG. 4 is a timing diagram of the semiconductor integrated circuit device of the present invention. Hereinafter, operations of the semiconductor integrated circuit device of the present invention will be explained with reference to the above drawings. In the description of FIG. 4 it is assumed that an operation mode of the semiconductor integrated circuit device is varied from a normal operation mode to a scan test operation mode for brevity.

First, a control signal SE has a low level in a normal operation mode. In this mode, each of the third pulse signals SPC and SPCB is maintained at a low level and a high level, respectively. Therefore, since tri-state inverter 232 is inactivated, the input path of the scan data SI is interrupted. During this time, when the clock signal CLK transitions from a low level to a high level, first and second pulse signals PPC, PPCB, NPC and NPCB are activated as illustrated in FIG. 4. During an activation interval of the second pulse signals NPC and NPCB, a normal data D1 is transmitted to a latch node B through the tri-state inverter 231. The normal data D1 transmitted to the latch node B is output as data Q through an inverter 235. During an activation interval of the first pulse signals PPC and PPCB, the data transmitted to a latch node B is not latched. As the first and second pulse signals PPC, PPCB, NPC, and NPCB are inactivated, a normal data input path is interrupted and the data transmitted to the latch node B are latched by inverters 233 and 234. Afterwards, the data latch operation will be carried out repeatedly in the above manner.

The control signal SE transitions from a low level to a high level during an arbitrary point in the clock cycle. Thus, the operation mode of the semiconductor integrated circuit device is switched from a normal operation mode to a scan test operation mode. This means that each of the second pulse signals NPC and NPCB are maintained at a low level and a high level, respectively. Therefore, the tri-state inverter 231 controlled by the second pulse signals NPC and NPCB is inactivated, and an input path of the normal data DI is interrupted. As the third pulse signals SPC and SPCB are activated, the scan data SI is latched in the scan test operation mode in the same manner as the normal data is latched in the normal operation mode. Thus, a detailed explanation of the scan test mode of operation is omitted.

According to the present invention, the scan flip-flop circuit 140 is embodied to operate in response to pulse signals synchronized with a clock signal CLK, such that an activation point of the control signal SE is not limited by an operation frequency of the clock signal CLK. Generally, if a control signal SE is activated at a scan test operation, the scan test operation should be carried out at an (N+1)th clock cycle. In the case where the scan flip-flop circuit 140 is embodied to operate in response to the clock signal CLK, undesired pulse signals may be generated during a clock cycle that is identical to the clock cycles where the control signal SE is activated. This is inconsistent with the above test conditions and a malfunction of the scan test operation can occur as a result.

When the scan flip-flop circuit 140 is embodied to operation in synchronization with pulse signals, a data hold margin H is ensured. In other words, a point of activating a control signal SE is freely determined within the remaining interval of the clock cycle except for the data hold margin. This means that there is no limit of entire timing due to a scan test function even if the scan test function is added to the semiconductor integration circuit device.

Figure 5:
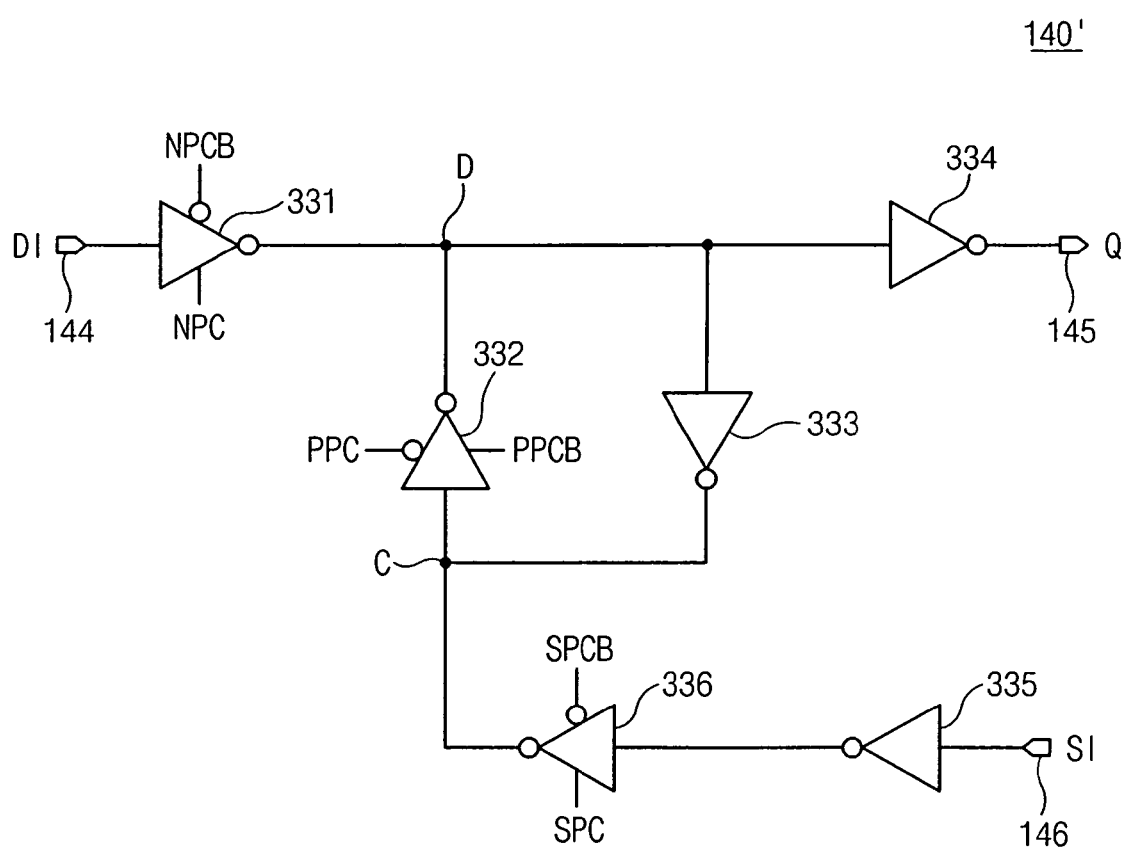
FIG. 5 is a circuit diagram of a pulse generating circuit in FIG. 1 according to another exemplary embodiment of the present invention.

FIG. 5 is a circuit diagram of the scan flip-flop circuit in FIG. 1 in accordance with another exemplary embodiment of the present invention. Referring to FIG. 5, a scan flip-flop circuit 140' of the present invention includes six inverters 331, 332, 333, 334, 335 and 336. The inverters 331 and 334 are serially connected between an input terminal 144 and an output terminal 145. The inverters 335 and 336 are connected between an input terminal SI 146 and a node C. An input terminal C of the inverter 332 is electrically connected to the node C, and an output terminal thereof is electrically connected to a node D. The input terminal of the inverter 333 is electrically connected to the node D, and an output terminal thereof is electrically connected to the node C. The inverters 332 and 333 compose a latch for latching the normal data DI during a normal mode of operation, and for latching the scan data SI during a scan data mode of operation.

In FIG. 5, the inverter 331 is controlled by the second pulse signals NPC and NPCB, the inverter 332 is controlled by the first pulse signals PPC and PPCB, and the inverter 336 is controlled by the third pulse signals SPC and SPCB. Each of the inverters 331, 332, and 336 is a tri-state inverter and each of the inverters 333, 334, and 335 is a standard CMOS inverter.

The semiconductor integrated circuit device operates in the substantially same way as illustrated in FIG. 4 except for a difference in a circuit organization of the scan flip-flop circuit. Therefore, a detailed explanation of the operation of semiconductor integrated circuit device including the scan flip-flop circuit in FIG. 5 will be omitted hereinafter.

In the present invention, only one scan flip-flop circuit and one pulse generating circuit are illustrated in FIG. 1. However, it is well known to those skilled in the art that a plurality of scan flip-flop circuits may be configured to operate in response to pulse signals generated by a single pulse generating circuit. In addition, it is also well known to those skilled in the art that a plurality of pulse generating circuits may be embodied to correspond to each of the scan flip-flop circuits. The scan flip-flop circuit according to the present invention operates in synchronization with a low-to-high transition of the clock signal, but it will be apparent to those skilled in the art that the scan flip-flop circuit and the pulse generating circuit can be embodied to operate in synchronization with a high-to-low transition of the clock signal.

According to the above scan flop-flop circuit, a scan function can be performed without lowering of speed at a normal operation. In addition, the scan flip-flop circuit operates based on a pulse signal both during a normal operation and during a scan test operation. This ensures that no timing restrictions are present due to the additional scan test function.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor integrated circuit device having a normal operation mode and a scan test operation mode, comprising:
   a pulse generating circuit generating a first pulse signal of a plurality of pulse signals that is synchronized with a clock signal in each of the normal operation mode and the scan test operation mode and the pulse generating circuit further generating a second pulse signal of the plurality of pulse signals in the normal operation mode and generating a third pulse signal of the plurality of pulse signals in the scan test operation mode; and
   a scan flip-flop circuit that receives the first, second, and third pulse signals, and that latches data in response to the received first pulse signal in each of the normal operation mode and the scan test operation mode.

2. The device of claim 1, wherein the pulse generating circuit comprises:
   a first signal generator generating the first pulse signal that is synchronized with the clock signal, wherein an intermediate pulse signal synchronized with the clock signal is generated from the clock signal;
   a second signal generator generating the second pulse signal that is synchronized with the intermediate pulse signal in response to a control signal ; and
   a third signal generator generating the third pulse signal synchronized with the intermediate pulse signal in response to the control signal.

3. The device of claim 2, wherein the first pulse signal is generated in synchronization with any one of a low-to-high transition and a high-to-low transition of the clock signal.

4. The device of claim 3, wherein the second pulse signal is generated when the control signal indicates the normal operation mode.

5. The device of claim 4, wherein the third pulse signal is generated when the control signal indicates the scan test operation mode.

6. The device of claim 5, wherein the scan flip-flop circuit comprises:
   a first input circuit receiving a normal data in response to the second pulse signal;
   a second input circuit receiving a scan test data in response to the third pulse signal; and
   a latch circuit for latching any one of outputs of the first and second input circuits in response to the first pulse signal.

7. The device of claim 6, wherein each of the first and second input circuits includes a tri-state inverter operating in response to a corresponding pulse signal.

8. The device of claim 6, wherein the latch circuit is connected to output terminals of the first and second input circuits and includes a tri-state inverter and a CMOS inverter performing a latch operation,
   wherein the tri-state inverter operates in response to the first pulse signal.

9. The device of claim 8, wherein the scan flip-flop circuit further includes an inverter connected to a common output terminal of the first and second input circuits.

10. The device of claim 5, wherein the scan flip-flop circuit comprises:
    a first input circuit receiving a normal data in response to the second pulse signal, being connected to a first latch node;
    a second input circuit receiving a scan data in response to the third pulse signal, being connected to a second latch node; and a latch circuit for latching any one of outputs of the first and second input circuits in response to the first pulse signal, being connected to the first and second latch nodes.

11. The device of claim 10, wherein the first input circuit includes a tri-state inverter operating in response to the second pulse signal.

12. The device of claim 10, wherein the second input circuit comprises:
an inverter receiving the scan data; and
a tri-state inverter operating in response to a second pulse signal, being connected between the output terminal of the inverter and the second latch node.

13. The device of claim 10, wherein the latch circuit includes a tri-state inverter and a CMOS inverter connected to perform a latch operation,
wherein the tri-state inverter operates in response to the first pulse signal.

14. The device of claim 10, wherein the scan flip-flop circuit further includes an inverter connected to the first latch node.

15. The device of claim 2, wherein an activation point of the control signal is freely determined within a cycle of the clock signal other than the data hold time.

16. A semiconductor integrated circuit device having a normal operation mode and a scan test operation mode, comprising:
a first input circuit receiving a first data in response to a first pulse signal in the normal operation mode;
a second input circuit receiving a second data in response to a second pulse signal in the scan test operation mode; and
a latch circuit for latching any one of outputs of the first and second input circuits in response to a third pulse signal,
wherein the third pulse signal is generated in synchronization with a transition of a clock signal in the normal operation and the scan test operation mode, wherein an intermediate pulse signal synchronized with the clock signal is generated from the clock signal, and wherein the first pulse signal is generated in synchronization with the intermediate pulse signal in the normal operation mode, and the second pulse signal is generated in synchronization with the intermediate pulse signal in the scan test operation mode.

17. The device of claim 16, wherein the transition of the clock signal is any one of a low-to-high transition and a high-to-low transition.

18. The device of claim 16, further including an inverter connected to a common output of the first and second input circuits.

19. The device of claim 16, wherein each of the first and second input circuits includes a tri-state inverter controlled by a corresponding pulse signal.

20. The device of claim 18, wherein the first and second input circuits, the latch circuit, and the inverter compose a scan flip-flop circuit.

21. The device of claim 16, wherein the latch circuit includes a tri-state inverter and an inverter arranged to latch outputs of the first and second input circuits,
wherein the tri-state inverter is controlled by the third pulse signal.

22. The device of claim 16, wherein the first input circuit includes a first tri-state inverter controlled by the first pulse signal.

23. The device of claim 22, wherein the second input circuit comprises:

a first inverter receiving the second data; and
a second tri-state inverter controlled by the second pulse signal, being connected between the inverter and the latch circuit.

24. A semiconductor integrated circuit device, comprising:
a first input terminal receiving a normal data;
a second input terminal receiving a scan data;
a data output terminal outputting an output data;
a first tri-state inverter operating in response to first pulse signals, being connected between the first input terminal and a first latch node;
a second tri-state inverter operating in response to second pulse signals, being connected between the second input terminal and the first latch node;
a first inverter including an input terminal connected to the first latch node and an output terminal connected to a second latch node;
a third tri-state inverter operating in response to third pulse signals, including an input terminal connected to the second latch node and an output terminal connected to the first latch node; and
a second inverter including an input terminal connected to the first latch node and an output terminal connected to the data output terminal.

25. The device of claim 24, wherein the first, second and third pulse signals are generated in synchronization with a transition of a clock signal.

26. The device of claim 25, wherein the transition of the clock signal includes any one of a low-to-high transition and a high-to-low transition.

27. A semiconductor integrated circuit device, comprising:
a first input terminal receiving a normal data;
a second input terminal receiving a scan data;
a data output terminal outputting an output data;
a first tri-state inverter operating in response to first pulse signals, being connected between the first input terminal and a first latch node;
a second tri-state inverter and a first inverter serially connected between the second input terminal and a second latch node, the second tri-state inverter operating in response to second pulse signals;
a second inverter including an input terminal connected to the first latch node and an output terminal connected to the second latch node;
a third tri-state inverter operating in response to third pulse signals, including an input terminal connected to the second latch node and an output terminal connected to the first latch node; and
a third inverter including an input terminal connected to the first latch node and an output terminal connected to the data output terminal.

28. The device of claim 27, wherein the first, second and third pulse signals are generated in synchronization with a transition of a clock signal.

29. The device of claim 28, wherein the transition of the clock signal includes any one of a low-to-high transition and a high-to-low transition.

30. A method of operating an integrated semiconductor device, comprising:
generating first, second and third pulse signals in response to a clock signal; and
latching a data in response to the first, second and third pulse signals,
wherein the data input in a normal operation mode is latched in synchronization with the first and second pulse signals, and the data input in a scan test operation mode is latched in synchronization with the first and the third pulse signals, and wherein the first pulse signal latches data in both the normal operation mode and scan test operation mode.

31. The method of claim 30, wherein the first, signal is generated in synchronization with a transition of the clock signal, wherein an intermediate pulse signal synchronized with the clock signal is generated from the clock signal, and wherein the second and third pulse signals are generated in synchronization with the intermediate pulse signal.

32. The method of claim 31, wherein the transition of the clock signal includes any one of a low-to-high transition and a high-to-low transition.

* * * * *